(12) United States Patent
Goshi et al.

(10) Patent No.: US 10,395,950 B2
(45) Date of Patent: Aug. 27, 2019

(54) SUBSTRATE PROCESSING APPARATUS, SUBSTRATE PROCESSING METHOD, AND RECORDING MEDIUM

(71) Applicant: Tokyo Electron Limited, Tokyo (JP)

(72) Inventors: Gentaro Goshi, Kumamoto (JP); Keisuke Egashira, Kumamoto (JP); Yosuke Kawabuchi, Kumamoto (JP); Hiromi Kiyose, Kumamoto (JP); Takuro Masuzumi, Kumamoto (JP); Hiroki Ohno, Kumamoto (JP); Kento Tsukano, Kumamoto (JP); Hiroshi Marumoto, Kumamoto (JP); Shotaro Kitayama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 15/801,803

(22) Filed: Nov. 2, 2017

(65) Prior Publication Data

US 2018/0130675 A1    May 10, 2018

(30) Foreign Application Priority Data

Nov. 4, 2016   (JP) ................................ 2016-216313

(51) Int. Cl.
*B01J 3/00*   (2006.01)
*B01J 3/06*   (2006.01)
(Continued)

(52) U.S. Cl.
CPC ........ *H01L 21/67034* (2013.01); *B01J 3/008* (2013.01); *B01J 3/06* (2013.01);
(Continued)

(58) Field of Classification Search
CPC ......... H01L 21/67034; H01L 21/02057; H01L 21/02101; H01L 21/67051; B01J 3/008; B01J 3/06
(Continued)

(56) References Cited

U.S. PATENT DOCUMENTS 5,088,443 A * 2/1992 Hastings .................. B05B 5/03
                                                  118/300
6,067,728 A * 5/2000 Farmer ............. H01L 21/67028
                                                  134/902
(Continued)

FOREIGN PATENT DOCUMENTS

JP       2013-012538 A    1/2013
WO   WO-2014153570 A9 *  8/2015 .......... B01J 19/0093

*Primary Examiner* — Stephen M Gravini
(74) *Attorney, Agent, or Firm* — Abelman Frayne & Schwab (57) ABSTRACT

A substrate processing apparatus performs: a pressure raising process of raising a pressure within the processing container to a processing pressure higher than a critical pressure of the processing fluid, after the substrate is accommodated in the processing container; and a circulation process of supplying the processing fluid to the processing container and discharging the processing fluid from the processing container while keeping a pressure at which the processing fluid is maintained in the supercritical state, within the processing container. In the pressure raising process, the supply of the processing fluid from the second fluid supply unit is stopped and the processing fluid is supplied from the first fluid supply unit into the processing container until at least the pressure within the processing container reaches the critical pressure. In the circulation process, the processing fluid is supplied into the processing container from the second fluid supply unit.

10 Claims, 5 Drawing Sheets

(51) Int. Cl.
  *B08B 7/00* (2006.01)
  *H01L 21/02* (2006.01)
  *H01L 21/67* (2006.01)

(52) U.S. Cl.
  CPC ...... *B08B 7/0021* (2013.01); *H01L 21/02057* (2013.01); *H01L 21/02101* (2013.01); *H01L 21/67051* (2013.01)

(58) Field of Classification Search
  USPC .......................................................... 34/337
  See application file for complete search history.

(56) References Cited

U.S. PATENT DOCUMENTS

| | | | | |
|---|---|---|---|---|
| 6,367,491 | B1* | 4/2002 | Marshall | B08B 7/0021 |
| | | | | 134/104.4 |
| 6,920,703 | B2* | 7/2005 | Taktsu | G03F 7/40 |
| | | | | 134/902 |
| 8,562,743 | B2* | 10/2013 | Strang | C23C 18/00 |
| | | | | 118/715 |
| 10,109,506 | B2* | 10/2018 | Kim | H01L 21/67017 |
| 2018/0130675 | A1* | 5/2018 | Goshi | H01L 21/02101 |
| 2019/0096717 | A1* | 3/2019 | Lee | H01L 21/67126 |

\* cited by examiner

SUBSTRATE PROCESSING APPARATUS, SUBSTRATE PROCESSING METHOD, AND RECORDING MEDIUM

CROSS-REFERENCE TO RELATED APPLICATIONS

This application is based on and claims priority from Japanese Patent Application No. 2016-216313, filed on Nov. 4, 2016, with the Japan Patent Office, the disclosure of which is incorporated herein in its entirety by reference.

TECHNICAL FIELD

The present disclosure relates to a technique of drying a liquid-adhering substrate using a processing fluid in a supercritical state.

BACKGROUND

In a semiconductor device manufacturing process where a stacked structure of an integrated circuit is formed on the surface of a substrate such as, for example, a semiconductor wafer (hereinafter, referred to as a "wafer"), a liquid processing such as, for example, a chemical liquid cleaning or a wet etching is performed. In order to remove, for example, a liquid adhering to the surface of the wafer due to such a liquid processing, a drying method using a processing fluid in a supercritical state has recently been used (see e.g., Japanese Patent Laid-Open Publication No. 2013-012538).

In the drying method, in the case where a fine pattern with a high aspect ratio is formed on the surface of the substrate, when a liquid within a recess of the pattern evaporates before the liquid within the recess of the pattern is replaced with the processing fluid in the supercritical state, a pattern collapse occurs. It is required to establish a technique of more reliably avoiding the occurrence of such an event.

SUMMARY

According to an aspect of the present disclosure, there is provided a substrate processing apparatus for drying a substrate having a liquid adhering to a surface thereof, using a processing fluid in a supercritical state. The substrate processing apparatus includes: a processing container; a substrate holder configured to horizontally hold the substrate within the processing container in a state in which the surface of the substrate is directed upwards; a first fluid supply unit provided below the substrate held by the substrate holder, and configured to supply a pressurized processing fluid; a second fluid supply unit provided at a side of the substrate held by the substrate holder, and configured to supply a pressurized processing fluid; a fluid discharge unit configured to discharge a processing fluid from the processing container; and a controller configured to control operations of the first fluid supply unit, the second fluid supply unit, and the fluid discharge unit. The controller causes the substrate processing apparatus to execute: a pressure raising process of supplying the pressurized processing fluid to the processing container so as to raise a pressure within the processing container to a processing pressure higher than a critical pressure of the processing fluid, after the substrate having the liquid adhering to the surface thereof is accommodated in the processing container; and a circulation process of supplying the processing fluid to the processing container and discharging the processing fluid from the processing container while keeping a pressure at which at least the processing fluid is maintained in the supercritical state, within the processing container. In the pressure raising process, the controller causes a supply of the processing fluid from the second fluid supply unit to be stopped and the processing fluid to be supplied from the first fluid supply unit into the processing container until at least the pressure within the processing container reaches the critical pressure of the processing fluid, and in the circulation process, the controller causes the processing fluid to be supplied into the processing container from the second fluid supply unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technique of preventing a liquid within a recess of a pattern from evaporating before being replaced with a processing fluid in a supercritical state.

According to an aspect of the present disclosure, there is provided substrate processing apparatus for drying a substrate having a liquid adhering to a surface thereof, using a processing fluid in a supercritical state. The substrate processing apparatus includes: a processing container; a substrate holder configured to horizontally hold the substrate within the processing container in a state in which the surface of the substrate is directed upwards; a first fluid supply unit provided below the substrate held by the substrate holder, and configured to supply a pressurized processing fluid; a second fluid supply unit provided at a side of the substrate held by the substrate holder, and configured to supply a pressurized processing fluid; a fluid discharge unit configured to discharge a processing fluid from the processing container; and a controller configured to control operations of the first fluid supply unit, the second fluid supply unit, and the fluid discharge unit. The controller causes the substrate processing apparatus to execute: a pressure raising process of supplying the pressurized processing fluid to the processing container so as to raise a pressure within the processing container to a processing pressure higher than a critical pressure of the processing fluid, after the substrate having the liquid adhering to the surface thereof is accommodated in the processing container; and a circulation process of supplying the processing fluid to the processing container and discharging the processing fluid from the processing container while keeping a pressure at which at least the processing fluid is maintained in the supercritical state, within the processing container. In the pressure raising process, the controller causes a supply of the processing fluid from the second fluid supply unit to be stopped and the processing fluid to be supplied from the first fluid supply unit into the processing container until at least the pressure within the processing container reaches the critical pressure of the processing fluid, and in the circulation process, the controller causes the processing fluid to be supplied into the processing container from the second fluid supply unit.

In the above-described substrate processing apparatus, in the pressure raising process, the controller causes the supply of the processing fluid from the second fluid supply unit to be stopped and the processing fluid to be supplied from the first fluid supply unit into the processing container until the pressure within the processing container reaches the processing pressure via the critical pressure from a point in time when the supply of the processing fluid into the processing container starts.

In the above-described substrate processing apparatus, in the pressure raising process, the controller causes the supply of the processing fluid from the second fluid supply unit to be stopped and the processing fluid to be supplied from the first fluid supply unit into the processing container until the pressure within the processing container reaches the critical pressure of the processing fluid from a point in time when a supply of the processing fluid into the processing container starts, and the controller causes the supply of the processing fluid from the first fluid supply unit to be stopped and the processing fluid to be supplied from the second fluid supply unit into the processing container, or the processing fluid to be supplied from both the first and second fluid supply units into the processing container, until the pressure within the processing container reaches the processing pressure after reaching the critical pressure of the processing fluid.

In the above-described substrate processing apparatus, the first fluid supply unit is provided to supply the processing fluid from a position below a central portion of the substrate held by the substrate holder, toward the central portion of the substrate.

In the above-described substrate processing apparatus, the second fluid supply unit is provided to supply the processing fluid from a side of the substrate substantially in a horizontal direction.

In the above-described substrate processing apparatus, the second fluid supply unit is provided to supply the processing fluid in parallel to the substrate from a position higher than an upper surface of the substrate, at the side of the substrate.

According to another aspect of the present disclosure, there is provided a substrate processing method that includes: accommodating a substrate having a pattern formed on a surface thereof and a liquid adhering to the surface, in a processing container; raising a pressure within the processing container to a processing pressure higher than a critical pressure of the processing fluid by supplying a pressurized processing fluid to the processing container; and performing a circulation process of supplying the pressurized processing fluid to the processing container and discharging the processing fluid from the processing container while keeping a pressure at which at least the processing fluid is maintained in a supercritical state, within the processing container. In the raising of the pressure, the pressurized processing fluid is supplied from a first fluid supply unit provided below the substrate until at least the pressure within the processing container reaches the critical pressure of the processing fluid, in the performing of the circulation process, the pressurized processing fluid is supplied from a second fluid supply unit provided at a side of the substrate, and in the raising of the pressure, the pressurized processing fluid is not supplied from the second fluid supply unit until at least the pressure within the processing container reaches the critical pressure of the processing fluid.

In the above-described method, in the raising of the pressure, the processing fluid is supplied into the processing container using the first fluid supply unit without using the second fluid supply unit until the pressure within the processing container reaches the processing pressure via the critical pressure from a point in time when the supply of the processing fluid into the processing container starts.

In the above-described method, in the raising of the pressure, the processing fluid is supplied into the processing container using the first fluid supply unit without using the second fluid supply unit until the pressure within the processing container reaches the critical pressure of the processing fluid from a point in time when a supply of the processing fluid into the processing container starts, and the processing fluid is supplied into the processing container using the second fluid supply unit without using the first fluid supply unit or the processing fluid is supplied into the processing container using both the first and second fluid supply units until the pressure within the processing container reaches the processing pressure after reaching the critical pressure of the processing fluid.

According to yet another aspect of the present disclosure, there is provided non-transitory computer-readable storage medium storing a computer-executable program that, when executed, causes a computer to control a substrate processing apparatus to execute the substrate processing method described above.

According to the exemplary embodiment of the present disclosure, it is possible to prevent a liquid within a recess of a pattern from evaporating before being replaced with a processing fluid in a supercritical state.

Hereinafter, an exemplary embodiment of the present disclosure will be described with reference to drawings. Meanwhile, the configuration illustrated in the drawings attached to the present specification may include portions in which, for example, sizes and scales are changed from those of actual ones for convenience of illustration and ease of understanding.

[Configuration of Substrate Processing System]

Figure 1:
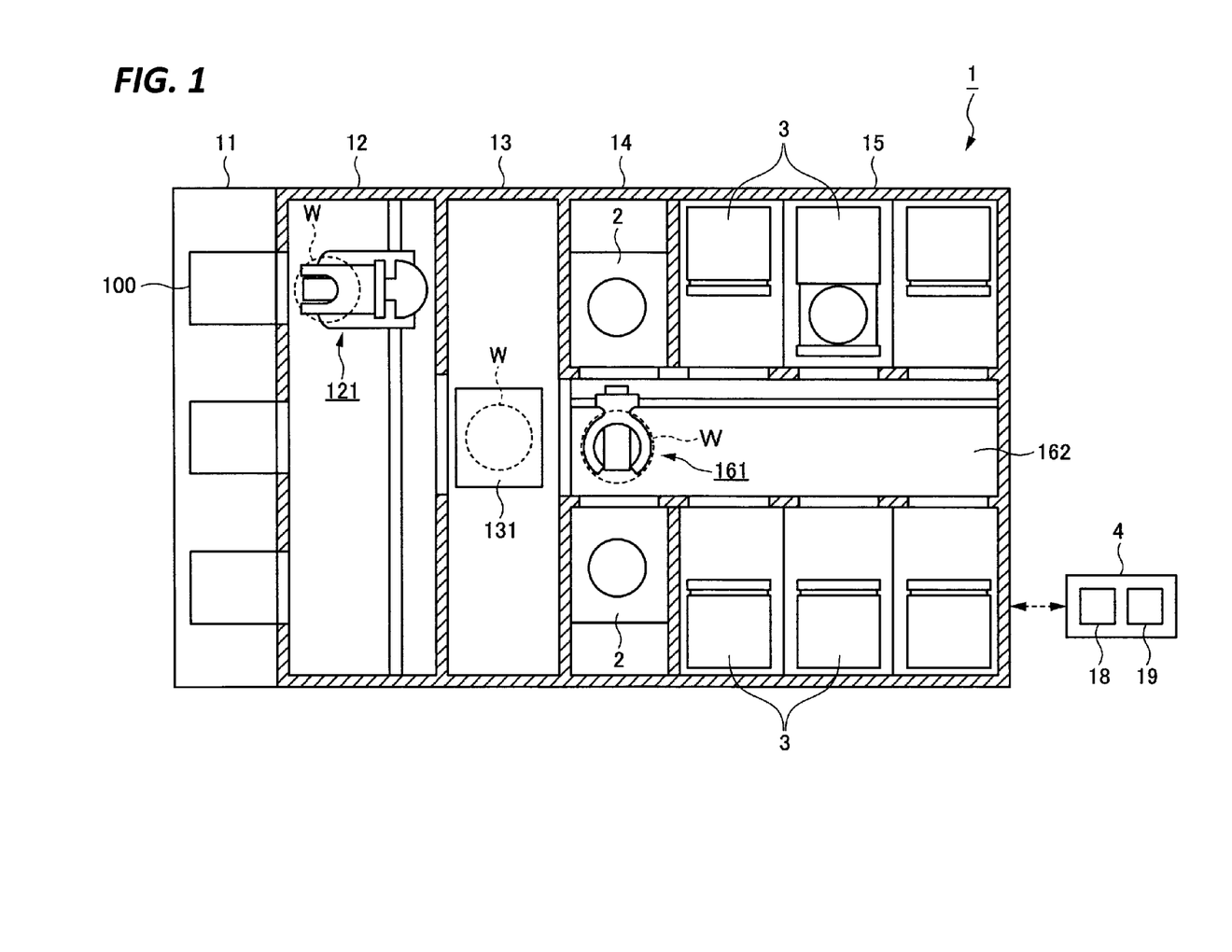
FIG. 1 is a cross-sectional plan view illustrating the overall configuration of a substrate processing system.

As illustrated in FIG. 1, a substrate processing system 1 includes: a plurality of cleaning devices 2 (two cleaning devices 2 in the example illustrated in FIG. 1) configured to perform a cleaning process by supplying a cleaning liquid to a wafer W; and a plurality of supercritical processing devices 3 (six supercritical processing devices 3 in the example illustrated in FIG. 1) configured to remove a dry-preventing liquid (isopropyl alcohol (IPA) in the present exemplary embodiment) adhering to the wafer W after the cleaning process by bringing the dry-preventing liquid into contact with a processing fluid in a supercritical state (carbon dioxide ($CO_2$) in the present exemplary embodiment).

In the substrate processing system 1, a FOUP 100 is placed in a placing section 11, and wafers W stored in the FOUP 100 are transferred to a cleaning processing section 14 and a supercritical processing section 15 via a carry-in/out section 12 and a transfer section 13. In the cleaning processing section 14 and the supercritical processing section 15, first, the wafers W are carried into the cleaning device 2 provided in the cleaning processing section 14 and subjected to a cleaning process. Then, the wafers W are carried into the supercritical processing device 3 provided in the supercritical processing section 15, and subjected to a drying process in which IPA is removed from the wafers W. In FIG. 1, a reference numeral "121" indicates a first conveyance mechanism configured to convey wafers W between the FOUP 100 and the transfer section 13, and a reference numeral "131" indicates a delivery shelf serving as a buffer in which the wafers W being conveyed between the carry-in/out section 12, and the cleaning processing section 14 and the supercritical processing section 15 are temporarily placed.

A wafer conveyance path 162 is connected to an opening of the transfer section 13, and the cleaning processing section 14 and the supercritical processing section 15 are provided along the wafer conveyance path 162. In the cleaning processing section 14, a total of two cleaning devices 2 are provided, that is, one cleaning device 2 at one side and one cleaning device 2 at the other side are disposed across the wafer conveyance path 162. Meanwhile, in the supercritical processing section 15, a total of six supercritical processing devices 3 functioning as substrate processing apparatuses configured to perform a drying process of removing IPA from wafers W are provided, that is, three supercritical processing devices 3 at one side and three supercritical processing devices 3 at the other side are disposed across the wafer conveyance path 162. A second conveyance mechanism 161 is disposed in the wafer conveyance path 162, and the second conveyance mechanism 161 is provided to be movable within the wafer conveyance path 162. The wafer W placed on the delivery shelf 131 is received by the second conveyance mechanism 161, and the second conveyance mechanism 161 carries the wafers W into the cleaning device 2 and the supercritical processing device 3. Meanwhile, the number and the arrangement mode of the cleaning devices 2 and the supercritical processing devices 3 are not particularly limited, but an appropriate number of cleaning devices 2 and an appropriate number of supercritical processing devices 3 are disposed in an appropriate mode according to, for example, the number of wafers W processed per unit time and a processing time of each cleaning device 2 and each supercritical processing device 3.

The cleaning device 2 is configured as, for example, a single wafer-type device that cleans the wafers W one by one by spin cleaning. In this case, while each wafer W is horizontally held and rotated around a vertical axis, a chemical liquid for cleaning or a rinse liquid for washing off the chemical liquid are supplied to a processing surface of the wafer W at an appropriate timing so that a cleaning process of the wafer W may be performed. The chemical liquid and the rinse liquid used in the cleaning device 2 are not particularly limited. For example, an SC1 liquid (that is, a mixed liquid of ammonia and hydrogen peroxide) which is an alkaline chemical liquid may be supplied to the wafer W to remove particles or organic pollutants from the wafer W. Then, deionized water (DIW) that is a rinse liquid may be supplied to the wafer W to wash off the SC1 liquid from the wafer W. A dilute hydrofluoric acid aqueous solution (diluted hydrofluoric acid (DHF)) which is an acidic chemical liquid may be supplied to the wafer W to remove a natural oxide film, and then DIW may be supplied to the wafer W to wash off the DHF aqueous solution from the wafer W.

Then, after a rinse process by the DIW is completed, the cleaning device 2 supplies IPA as a dry-preventing liquid to the wafer W while rotating the wafer W, so that the DIW remaining on the processing surface of the wafer W is replaced with the IPA. Then, the rotation of the wafer W is gently stopped. Here, a sufficient amount of IPA is supplied to the wafer W, and a puddle of the IPA is formed on the surface of the wafer W formed with a semiconductor pattern so that a liquid film of the IPA is formed on the surface of the wafer W. The wafer W keeping the puddle of the IPA is carried out of the cleaning device 2 by the second conveyance mechanism 161.

The IPA applied to the surface of the wafer W as described above serves to prevent the wafer W from being dried. Particularly, in order to suppress the occurrence of a so-called pattern collapse on the wafer W due to IPA evaporation during the conveyance of the wafer W from the cleaning device 2 to the supercritical processing device 3, the cleaning device 2 applies a sufficient amount of IPA to the wafer W so that an IPA film with a relatively large thickness may be formed on the surface of the wafer W.

The wafer W carried out of the cleaning device 2 is carried into a processing container of the supercritical processing device 3 by the second conveyance mechanism 161 in the state in which the IPA is spread thereon. Then, a drying process of the IPA is performed in the supercritical processing device 3.

[Supercritical Processing Device]

Hereinafter, descriptions will be made of the supercritical processing device 3 with reference to FIGS. 2 to 4.

Figure 2:
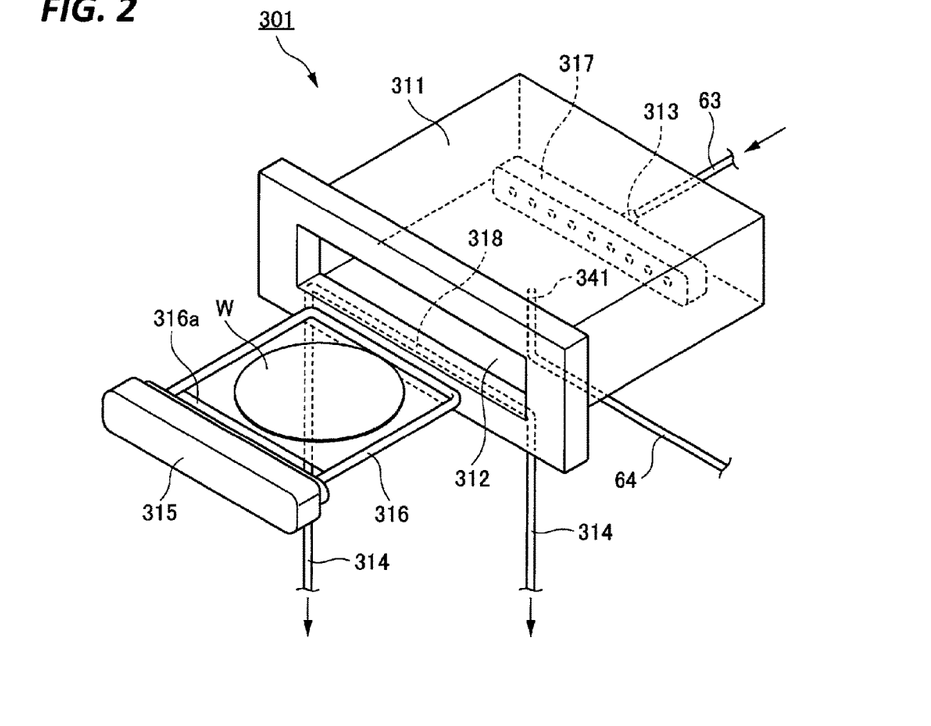
FIG. 2 is an external perspective view of a processing container of a supercritical processing device.
Figure 3:
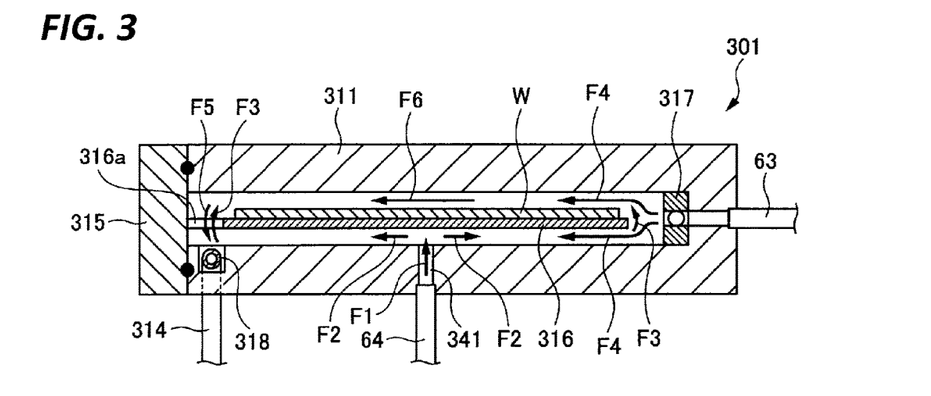
FIG. 3 is a sectional view of the processing container.

As illustrated in FIGS. 2 and 3, a processing container 301 includes a container main body 311 in which an opening 312 through which a wafer W is loaded and unloaded is formed, a holding plate 316 that horizontally holds the wafer W as a processing target, and a lid member 315 that supports the holding plate 316, and air-tightly seals the opening 312 when the wafer W is carried into the container main body 311.

The container main body 311 is a container inside which a processing space capable of accommodating, for example, a wafer W with a diameter of 300 mm is formed. A fluid supply header (a first fluid supply unit) 317 is provided at one end side within the container main body 311, and a fluid discharge header (a fluid discharge unit) 318 is provided at the other end side. In the illustrated example, the fluid supply header 317 is constituted by a block body in which a large number of openings (first fluid supply ports) are formed, and the fluid discharge header 318 is constituted by a pipe in which a large number of openings (fluid discharge ports) are formed. The first fluid supply ports of the fluid supply header 317 may be located at a position slightly higher than the upper surface of the wafer W held by the holding plate 316.

The configuration of the fluid supply header 317 and the fluid discharge header 318 is not limited to the illustrated example, but, for example, the fluid discharge header 318 may be formed as a block body, and the fluid supply header 317 may be formed as a pipe.

When the holding plate 316 is viewed from below, the holding plate 316 covers almost the entire area of the lower surface of the wafer W. The holding plate 316 has an opening 316a at an end portion at the lid member 315 side. A processing fluid present in the space above the holding plate 316 is guided to the fluid discharge header 318 through the opening 316a (see the arrow F5 in FIG. 3).

The fluid supply header 317 supplies the processing fluid into the container main body 311 (the processing container 301) toward a substantially horizontal direction. The horizontal direction mentioned herein refers to a direction perpendicular to a vertical direction in which a gravity acts, and generally to a direction parallel to a direction in which the flat surface of the wafer W held by the holding plate 316 extends.

The fluid within the processing container 301 is discharged to the outside of the processing container 301 through the fluid discharge header 318. The fluid discharged through the fluid discharge header 318 includes not only the processing fluid supplied into the processing container 301 through the fluid supply header 317, but also IPA adhering to the surface of the wafer W and dissolved in the processing fluid.

A fluid supply nozzle (a second fluid supply unit) 341 is provided at the bottom portion of the container main body 311 to supply the processing fluid into the processing container 301. In the illustrated example, the fluid supply nozzle 341 is configured with an opening formed in the bottom wall of the container main body 311. The fluid supply nozzle 341 is located below (for example, just below) the central portion of the wafer W, and supplies the processing fluid into the processing container 301 toward the central portion of the wafer W (for example, vertically upwards).

The processing container 301 further includes a pressing mechanism (not illustrated). The pressing mechanism serves to press the lid member 315 toward the container main body 311 against the internal pressure caused by the supercritical-state processing fluid supplied into the processing space, thereby air-tightly sealing the processing space. It is desirable to provide, for example, an insulating material or a tape heater (not illustrated) at the ceiling wall or the bottom wall of the container main body 311 such that the processing fluid supplied into the processing space is kept at a temperature of a supercritical state.

Figure 4:
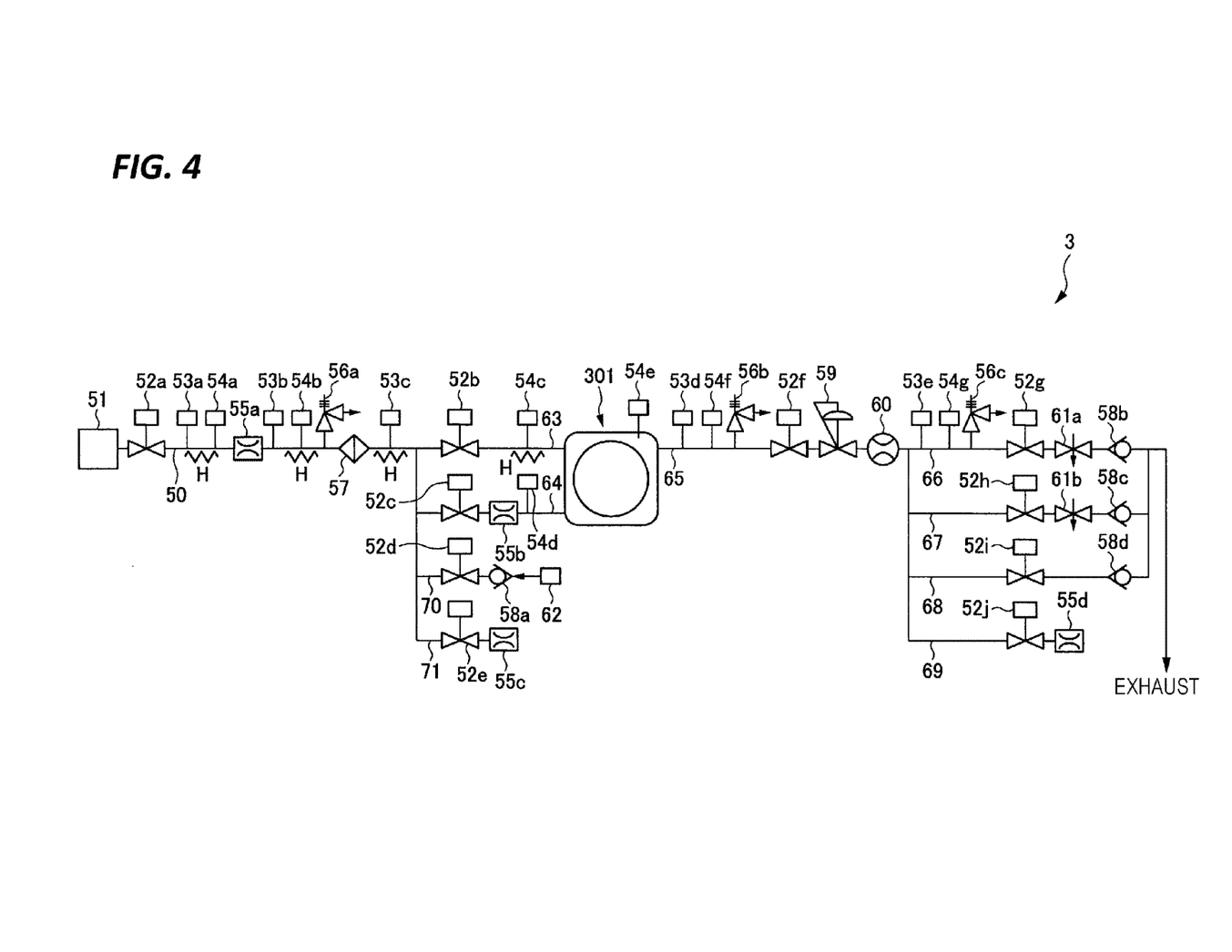
FIG. 4 is a piping system view of the supercritical processing device.

As illustrated in FIG. 4, the supercritical processing device 3 includes a fluid supply tank 51 which is a supply source of a processing fluid in a supercritical state, for example, a processing fluid at a high pressure ranging from about 16 MPa to 20 MPa (megapascals). A main supply line 50 is connected to the fluid supply tank 51. The main supply line 50, in the middle thereof, diverges into a first supply line 63 connected to the fluid supply header (the first fluid supply unit) 317 within the processing container 301, and a second supply line 64 connected to the fluid supply nozzle (the second fluid supply unit) 341.

An open/close valve 52a, an orifice 55a, a filter 57, and an open/close valve 52b are provided in order from the upstream side between the fluid supply tank 51 and the fluid supply header 317 (that is, the main supply line 50 and the first supply line 63 lead from the main supply line 50). The second supply line 64 diverges from the main supply line 50, at a location between the filter 57 and the open/close valve 52b. An open/close valve 52c is provided in the second supply line 64.

The orifice 55a is provided to lower the flow velocity of the processing fluid supplied from the fluid supply tank 51 so as to protect the wafer W. The filter 57 is provided to remove foreign matters (particle-causing substances) contained in the processing fluid flowing through the main supply line 50.

The supercritical processing device 3 further includes a purge gas supply line 70 connected to a purge device 62 through an open/close valve 52d and a check valve 58a, and a discharge line 71 connected to a space outside the supercritical processing device 3 through an open/close valve 52e and an orifice 55c. The purge gas supply line 70 and the discharge line 71 are connected to the main supply line 50, the first supply line 63, and the second supply line 64.

The purge gas supply line 70 is used, for example, for the purpose of filling the processing container 301 with an inert gas, thereby keeping a clean state while the supply of the processing fluid from the fluid supply tank 51 to the processing container 301 is stopped. The discharge line 71 is used, for example, for discharging the processing fluid remaining within the supply line between the open/close valve 52a and the open/close valve 52b to the outside while the supercritical processing device 3 is powered OFF.

A main discharge line 65 is connected to the fluid discharge header 318 within the processing container 301. The main discharge line 65, in the middle thereof, branches into a first discharge line 66, a second discharge line 67, a third discharge line 68, and a fourth discharge line 69.

An open/close valve 52f, a back pressure valve 59, a concentration sensor 60, and an open/close valve 52g are provided in this order from the upstream side in the main discharge line 65 and the first discharge line 66 lead from the main discharge line 65.

The back pressure valve 59 is opened when a primary side pressure (which is the same as the pressure within the processing container 301) exceeds a set pressure, so that the fluid flows toward a secondary side and the primary side pressure is kept at the set pressure. The set pressure of the back pressure valve 59 may be changed by the controller 4 at any time.

The concentration sensor 60 is a sensor that measures an IPA concentration in the fluid flowing through the main discharge line 65.

A needle valve (a variable throttle) 61a and a check valve 58b are provided at the downstream side of the open/close valve 52g in the first discharge line 66. The needle valve 61a is a valve that adjusts a flow rate of the fluid discharged to the outside of the supercritical processing device 3 through the first discharge line 66.

The second discharge line 67, the third discharge line 68, and the fourth discharge line 69 diverge from the main discharge line 65 at a location between the concentration sensor 60 and the open/close valve 52g. An open/close valve 52h, a needle valve 61b, and a check valve 58c are provided in the second discharge line 67. An open/close valve 52i and a check valve 58d are provided in the third discharge line 68. An open/close valve 52j and an orifice 55d are provided in the fourth discharge line 69.

The second discharge line 67 and the third discharge line 68 are connected to a first discharge destination, for example, a fluid recovery device, and the fourth discharge line 69 is connected to a second discharge destination, for example, an atmospheric space outside the supercritical processing device 3 or a factory exhaust system.

When the fluid is discharged from the processing container 301, at least one of the open/close valves 52g, 52h, 52i, and 52j is opened. Particularly, when the supercritical processing device 3 is stopped, the open/close valve 52j may be opened so that the fluid present in the first discharge line 66 between the concentration sensor 60 and the open/close valve 52g may be discharged to the outside of the supercritical processing device 3.

A pressure sensor configured to detect the pressure of the fluid and a temperature sensor configured to detect the temperature of the fluid are provided at various places of the line through which the fluid flows in the supercritical processing device 3. In the example illustrated in FIG. 4, a pressure sensor 53a and a temperature sensor Ma are provided between the open/close valve 52a and the orifice 55a, a pressure sensor 53b and a temperature sensor 54b are provided between the orifice 55a and the filter 57, a pressure sensor 53c. is provided between the filter 57 and the open/close valve 52b, a temperature sensor 54c is provided between the open/close valve 52b and the processing container 301, and a temperature sensor 54d is provided between an orifice 55b and the processing container 301. A pressure sensor 53d and a temperature sensor 54f are provided between the processing container 301 and the open/close valve 52f, and a pressure sensor 53e and a temperature sensor 54g are provided between the concentration sensor 60 and the open/close valve 52g. A temperature sensor 54e is provided to detect the temperature of the fluid within the processing container 301.

Four heaters H are provided in the main supply line 50 and the first supply line 63 to adjust the temperature of the processing fluid to be supplied to the processing container 301. The heater H may also be provided in the discharge line at the downstream side of the processing container 301.

A safety valve (a relief valve) 56a is provided between the orifice 55a and the filter 57 in the main supply line 50, a safety valve 56b is provided between the processing container 301 and the open/close valve 52f, and a safety valve 56c is provided between the concentration sensor 60 and the open/close valve 52g. The safety valves 56a to 56c urgently discharge the fluid within the line to the outside in the case of an abnormality such as the case where the pressure within the line (the pipe) provided with the safety valves becomes excessive.

The controller 4 receives measurement signals from various sensors (e.g., the pressure sensors 53a to 53e, the temperature sensors 54a to 54g, and the concentration sensor 60) illustrated in FIG. 3, and sends control signals (e.g., open/close signals of the open/close valves 52a to 52j, a set pressure regulating signal of the back pressure valve 59, and opening degree regulating signals of the needle valves 61a and 61b) to various functional elements. The controller 4 is, for example, a computer, and includes a calculator 18 and a storage 19. The storage 19 stores a program that controls various processings to be executed in the substrate processing system 1. The calculator 18 controls an operation of the substrate processing system 1 by reading and executing the program stored in the storage 19. The program may be recorded in a computer-readable storage medium, and then installed from the storage medium to the storage 19 of the controller 4. The computer-readable storage medium may be, for example, a hard disk (HD), a flexible disk (FD), a compact disk (CD), a magneto-optical disk (MO), or a memory card.

[Supercritical Drying Process]

Hereinafter, brief descriptions will be made of a drying mechanism of IPA using a processing fluid (for example, carbon dioxide ($CO_2$)) in a supercritical state, with reference to FIGS. 5A to 5D.

Figure 5A:
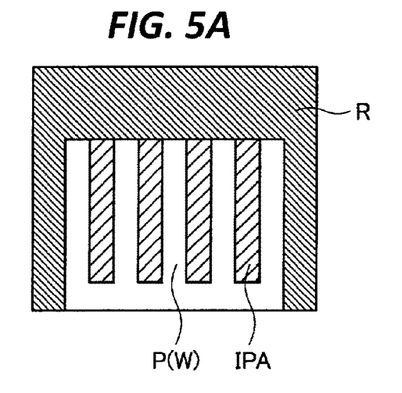
FIGS. 5A to 5D are views for explaining a drying mechanism of IPA.

Immediately after a processing fluid R in a supercritical state is introduced into the processing container 301, as illustrated in FIG. 5A, only IPA is present within a recess of a pattern P of a wafer W.

Figure 5B:
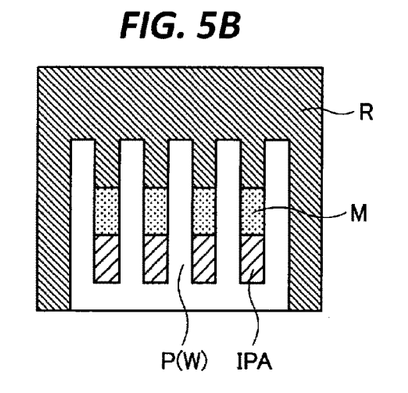

The IPA within the recess comes into contact with the processing fluid R in the supercritical state, gradually dissolves in the processing fluid R, and is gradually replaced by the processing fluid R as illustrated in FIG. 5B. Here, in the recess, besides the IPA and the processing fluid R, a mixed fluid M in which the IPA is mixed with the processing fluid R is present.

Figure 5C:
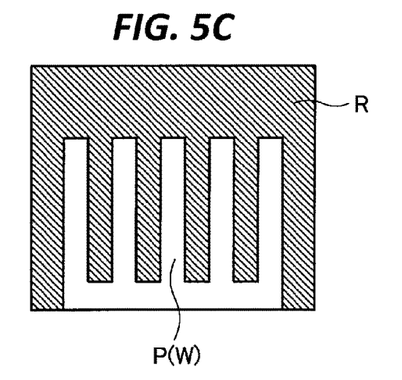

As the replacement of the IPA by the processing fluid R within the recess progresses, the IPA present within the recess decreases, and finally, as illustrated in FIG. 5C, only the processing fluid R in the supercritical state is present within the recess.

Figure 5D:
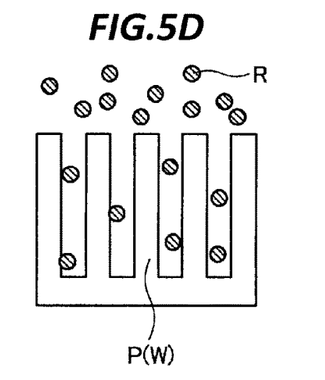

After the IPA is removed from the inside of the recess, the pressure within the processing container 301 is lowered to an atmospheric pressure. Thus, as illustrated in FIG. 5D, the processing fluid R changes from a supercritical state to a gas state, and the inside of the recess is occupied only by a gas. In this manner, the IPA within the recess of the pattern P is removed, and the drying process of the wafer W is completed.

Next, descriptions will be made of a drying method (a substrate processing method) executed using the above described supercritical processing device 3. Meanwhile, the drying method to be described below is automatically executed based on a processing recipe and a control program stored in the storage 19, under the control of the controller 4.

<Loading Process>

After having been subjected to a cleaning process in the cleaning device 2, the wafer W is carried out of the cleaning device 2 by the second conveyance mechanism 161 in a state where the inside of the recess of the pattern on the surface of the wafer W is filled with IPA and a puddle of the IPA is formed on the surface. The second conveyance mechanism 161 places the wafer on the holding plate 316, then the holding plate 316 on which the wafer is placed advances into the container main body 311, and then the lid member 315 is engaged with the container main body 311 in a sealing manner Accordingly, the loading of the wafer is completed.

Figure 6:
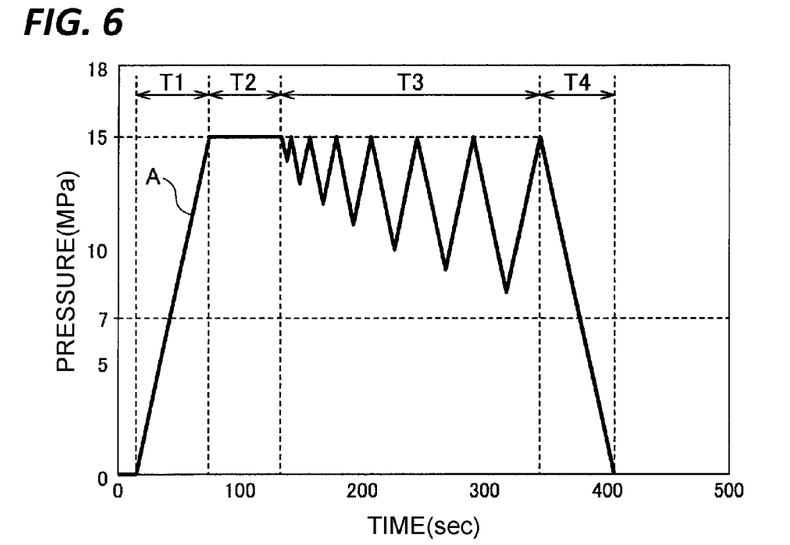
FIG. 6 is a graph illustrating a change of a pressure within the processing container during a drying process.

Next, according to the order illustrated in the time chart of FIG. 6, the processing fluid ($CO_2$) is supplied into the processing container 301, and a drying process of the wafer W is performed thereby. Polygonal line A illustrated in FIG. 6 indicates a relationship between an elapsed time from a point in time when the drying process starts and a pressure within the processing container 301.

<Pressure Raising Process>

First, a pressure raising process (T1) is performed, and $CO_2$ (carbon dioxide) as a processing fluid is supplied from the fluid supply tank 51 into the processing container 301. Specifically, the open/close valves 52a, 52c, and 52f are opened, and the open/close valves 52b and 52d, and the open/close valve 52e are closed. The open/close valves 52g, 52h, and 52i are opened, and the open/close valve 52j is closed. The needle valves 61a and 61b are adjusted to a predetermined opening degree. The set pressure of the back pressure valve 59 is set to a pressure at which $CO_2$ within the processing container 301 may be kept at a supercritical state, for example, 15 MPa. Accordingly, $CO_2$ in the supercritical state at a pressure of about 16 MPa is ejected from the fluid supply tank 51, toward the lower surface of the holding plate 316 through the fluid supply nozzle 341 just below the central portion of the wafer W.

$CO_2$ ejected from the fluid supply nozzle 341 (see arrow F1 in FIG. 3) collides with the holding plate 316 that covers the lower surface of the wafer W, radially spreads along the lower surface of the holding plate 316 (see arrow F2 in FIG. 3), and then flows into the space at the upper surface side of the wafer W through a gap between the edge of the holding plate 316 and the side wall of the container main body 311, and the opening 316a of the holding plate 316 (see the arrow F3 in FIG. 3). Since the back pressure valve 59 is kept fully closed until the set pressure (15 MPa) is reached, $CO_2$ does not flow from the processing container 301. Thus, the pressure within the processing container 301 gradually increases.

At the initial stage of the pressure raising process (T1), the pressure of $CO_2$ in the supercritical state fed from the fluid supply tank 51 is lowered while $CO_2$ passes through the orifice 55a, and also is lowered when $CO_2$ flows into the processing container 301 in a normal pressure state. Accordingly, at the initial stage of the pressure raising process (T1), the pressure of $CO_2$ flowing into the processing container 301 is lower than a critical pressure (for example, about 7 MPa), that is, $CO_2$ in a gas state flows into the processing container 301. Then, as the inside of the processing container 301 is gradually filled with $CO_2$, the pressure within the processing container 301 gradually increases. When the pressure within the processing container 301 exceeds a critical pressure, $CO_2$ present within the processing container 301 is placed in a supercritical state.

Figure 7:
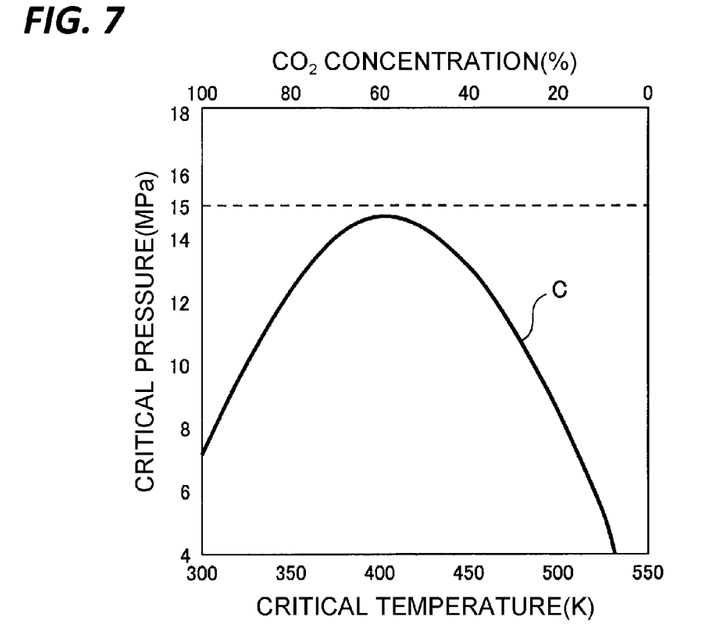
FIG. 7 is a graph illustrating a relationship between a $CO_2$ concentration, and a critical temperature and a critical pressure, in a mixed fluid containing IPA and $CO_2$.

In the pressure raising process (T1), when the pressure within the processing container 301 increases and exceeds the critical pressure, the processing fluid within the processing container 301 is placed in the supercritical state, and IPA on the wafer W starts to dissolve in the processing fluid in the supercritical state. Then, a mixing ratio of IPA to $CO_2$ in a mixed fluid containing $CO_2$ and IPA gradually changes. Meanwhile, it cannot be said that the mixing ratio is uniform over the entire surface of the wafer W. In order to prevent an unexpecting pattern collapse by the vaporization of the mixed fluid, in the pressure raising process (T1), the pressure within the processing container 301 rises to a pressure that ensures that $CO_2$ within the processing container 301 is placed in a supercritical state (here, 15 MPa) regardless of the $CO_2$ concentration in the mixed fluid. Here, the "pressure that ensures that $CO_2$ is placed in the supercritical state" is a pressure higher than a maximum value of a pressure indicated by the curve C in the graph of FIG. 7. The pressure (15 MPa) is called a "processing pressure."

<Keeping Process>

When the pressure within the processing container 301 rises to the processing pressure (15 MPa) by the pressure raising process (T1), the open/close valve 52b and the open/close valve 52f located at the upstream side and the downstream side of the processing container 301, respectively, are closed. Then, the process shifts to a keeping process (T2) in which the pressure within the processing container 301 is kept. The keeping process is continued until the IPA concentration and the $CO_2$ concentration in the mixed fluid within the recess of the pattern P of the wafer W become predetermined concentrations (for example, IPA concentration: 30% or less, $CO_2$ concentration: 70% or more). The time for the keeping process (T2) may be determined through experiments. In the keeping process (T2), the open/close states of other valves are the same as the open/close states in the pressure raising process (T1).

<Circulation Process>

A circulation process (T3) is performed after the keeping process (T2). The circulation process (T3) may be performed by alternately repeating a pressure lowering step in which the mixed fluid of $CO_2$ and IPA is discharged from the inside of the processing container 301 so as to lower the pressure within the processing container 301, and a pressure raising step in which new $CO_2$, which does not contain IPA, is supplied into the processing container 301 from the fluid supply tank 51 so as to raise the pressure within the processing container 301.

The circulation process (T3) is performed by opening, for example, the open/close valve 52b and the open/close valve 52f, and repeatedly raising and lowering the set pressure of the back pressure valve 59. Alternatively, the circulation process (T3) may be performed by repeatedly opening and closing the open/close valve 52f in a state where the open/close valve 52b is opened and the set pressure of the back pressure valve 59 is set to a low value.

In the circulation process (T3), $CO_2$ is supplied into the processing container 301 using the fluid supply header 317 (see arrow F4 in FIG. 3). The fluid supply header 317 may supply $CO_2$ at a larger flow rate than the fluid supply nozzle 341. In the circulation process (T3), since the pressure within the processing container 301 is maintained at a pressure sufficiently higher than the critical pressure, there is no problem in drying even when $CO_2$ in a large flow rate collides with the wafer W surface, or flows in the vicinity of the wafer W surface. Thus, the fluid supply header 317 is used with an emphasis on reducing a processing time.

In the pressure raising step, the pressure within the processing container 301 rises to the processing pressure (15 MPa). In the pressure lowering step, the pressure within the processing container 301 is lowered from the processing pressure to a predetermined pressure (a pressure higher than the critical pressure). In the pressure lowering step, the processing fluid is supplied into the processing container 301 through the fluid supply header 317, and the processing fluid is discharged from the processing container 301 through the fluid discharge header 318. Thus, a laminar flow of the processing fluid that flows substantially in parallel to the surface of the wafer W is formed within the processing container 301 (see arrow F6 in FIG. 3).

As the circulation process is performed, the replacement of IPA by $CO_2$ within the recess of the pattern of the wafer W is facilitated. As the replacement of IPA by $CO_2$ within the recess progresses, the critical pressure of the mixed fluid gradually decreases as illustrated on the left side in FIG. 7. Thus, it is possible to gradually lower the pressure within the processing container 301 at the end of each pressure lowering step while satisfying a condition that the pressure is higher than the critical pressure of the mixed fluid corresponding to the $CO_2$ concentration in the mixed fluid.

<Discharge Process>

When the replacement of IPA by $CO_2$ within the recess of the pattern is completed through the circulation process (T3), a discharge process (T4) is performed. The discharge process (T4) may be performed by closing the open/close valves 52a, 52b, 52c, 52d, and 52e, setting the set pressure of the back pressure valve 59 to a normal pressure, opening the open/close valves 52f, 52g, 52h, and 52i, and closing the open/close valve 52j. When the pressure within the processing container 301 becomes lower than the critical pressure of $CO_2$ by the discharge process (T4), $CO_2$ in the supercritical state is vaporized, and is separated from the inside of the recess of the pattern. Accordingly, the drying process on one wafer W is completed.

According to the above described exemplary embodiment, in the pressure raising process (T1), $CO_2$ is supplied into the processing container 301 from the fluid supply nozzle 341 below the wafer W. Thus, it is possible to more reliably prevent a pattern collapse. This point will be described below.

When IPA in a liquid state present on the surface of the wafer W is exposed to the flow of $CO_2$ in a gas state, the IPA may evaporate, and here, a pattern collapse may occur. In the pressure raising process (T1), when $CO_2$ in a gas state is supplied into the processing container 301 from the fluid supply header 317 at the side of the wafer W, the flow of $CO_2$ at a relatively high flow velocity directly collides with a puddle of the IPA, or passes through the vicinity of the puddle of the IPA. Thus, the evaporation of the IPA tends to easily occur.

In contrast, in the present exemplary embodiment, $CO_2$ ejected from the fluid supply nozzle 341 does not directly flow toward the surface of the wafer W or the space in the vicinity of the surface, but collides with the lower surface central portion of the holding plate 316, radially spreads along the lower surface of the holding plate 316, and then flows into the space at the upper surface side of the wafer W. That is, in the present exemplary embodiment, there is no direct flow of $CO_2$ from a processing fluid ejecting port toward the surface of the wafer W or the space in the vicinity of the surface. Thus, it is possible to largely suppress the IPA from evaporating by the supply of $CO_2$ in a gas state into the processing container 301. Meanwhile, when $CO_2$ in the gas state flows into the space at the upper surface side of the wafer W, the flow velocity of $CO_2$ is largely reduced as compared to when $CO_2$ is ejected from the fluid supply nozzle 341. Since the orifice 55b is present in the second supply line, the flow velocity of $CO_2$ ejected from the fluid supply nozzle 341 is originally small. Accordingly, the evaporation of IPA is further suppressed.

In the above described exemplary embodiment, the fluid supply nozzle 341 is located, for example, just below the central portion of the wafer W accommodated in the processing container 301, but the present disclosure is not limited thereto. The fluid supply nozzle 341 only has to be located at a position below the holding plate 316, that is, a position where the fluid supply nozzle 341 is not seen when the holding plate 316 on which the wafer W is placed is viewed directly above. That is, the $CO_2$ gas ejected from the fluid supply nozzle 341 only has to collide with the lower surface of the holding plate 316 or the back surface (the lower surface) of the wafer W.

Meanwhile, when the position of the fluid supply nozzle 341 largely deviates from the position just below the central portion of the wafer W, the flow of the $CO_2$ gas within the processing container 301 becomes non-uniform. Then, the flow of the $CO_2$ gas may wrap around into the surface of the wafer W. Thus, it is desirable to dispose the fluid supply nozzle 341 at a position near the position just below the central portion of the wafer W. From the viewpoint of preventing or suppressing the flow of the $CO_2$ gas from wrapping around into the surface of the wafer W, it is desirable that the fluid supply nozzle 341 ejects $CO_2$ upwards in the vertical direction or substantially directly upwards.

In the above described exemplary embodiment, $CO_2$ is supplied into the processing container 301 only from the fluid supply nozzle 341 over the entire period of the pressure raising process (T1), but the present disclosure is not limited thereto. When the pressure of the processing container 301 exceeds the critical pressure (about 7 MPa) of $CO_2$ as a processing fluid, $CO_2$ may be supplied into the processing container 301 from the fluid supply header 317, or may be supplied into the processing container 301 from both the fluid supply header 317 and the fluid supply nozzle 341. Also in these cases, a pattern collapse may be prevented.

However, as in the above described exemplary embodiment, it is desirable to supply $CO_2$ into the processing container 301 only from the fluid supply nozzle 341 over the entire period of the pressure raising process (T1). This is because a pattern collapse may be more reliably prevented. In contrast, when $CO_2$ is supplied into the processing container 301 from the fluid supply header 317, the supplied $CO_2$ may directly collide with a puddle formed of IPA or a mixed fluid containing IPA and $CO_2$, and agitate the puddle, and thus particles tend to easily occur.

As a result of actual tests, when $CO_2$ was supplied into the processing container 301 only from the fluid supply nozzle 341 over the entire period of the pressure raising process (T1), it was possible to prevent a pattern collapse, and the level of occurrence of particles was not problematic. Meanwhile, when $CO_2$ was supplied from the fluid supply header 317 or from both the fluid supply header 317 and the fluid supply nozzle 341 in the latter half of the pressure raising process (T1) (after the pressure within the processing container 301 exceeded about 7 MPa), it was possible to prevent a pattern collapse, but the particle level became degraded.

Meanwhile, the use of the fluid supply header 317 may further increase a pressure raising speed as compared to the use of the fluid supply nozzle 341. Thus, depending on a required particle level, $CO_2$ may be supplied into the processing container 301 using the fluid supply header 317 in the latter half of the pressure raising process (T1) with an emphasis on a throughput.

For example, a processing fluid used for a drying process may be a fluid other than $CO_2$ (for example, a fluorine-based fluid). Also, it is possible to use any fluid that may remove, in a supercritical state, a puddle of a dry-preventing liquid formed on the substrate, as a processing fluid. The dry-preventing liquid is also not limited to IPA, but any liquid usable as a dry-preventing liquid may be employed. A substrate as a processing target is not limited to the above described semiconductor wafer W, but other substrates such as, for example, a glass substrate for an LCD, and a ceramic substrate may be employed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus for drying a substrate having a liquid adhering to a surface thereof, using a processing fluid in a supercritical state, the substrate processing apparatus comprising:
    a processing container;
    a substrate holder configured to horizontally hold the substrate within the processing container in a state in which the surface of the substrate is directed upwards;
    a first fluid supply unit provided below the substrate held by the substrate holder, and configured to supply a pressurized processing fluid;
    a second fluid supply unit provided at a side of the substrate held by the substrate holder, and configured to supply a pressurized processing fluid;
    a fluid discharge unit configured to discharge a processing fluid from the processing container; and
    a controller configured to control operations of the first fluid supply unit, the second fluid supply unit, and the fluid discharge unit,
    wherein the controller causes the substrate processing apparatus to execute:
    a pressure raising process of supplying the pressurized processing fluid to the processing container so as to raise a pressure within the processing container to a processing pressure higher than a critical pressure of the processing fluid, after the substrate having the liquid adhering to the surface thereof is accommodated in the processing container; and a circulation process of supplying the processing fluid to the processing container and discharging the processing fluid from the processing container while keeping a pressure at which at least the processing fluid is maintained in the supercritical state, within the processing container, and wherein in the pressure raising process, the controller causes a supply of the processing fluid from the second fluid supply unit to be stopped and the processing fluid to be supplied from the first fluid supply unit into the processing container until at least the pressure within the processing container reaches the critical pressure of the processing fluid, and in the circulation process, the controller causes the processing fluid to be supplied into the processing container from the second fluid supply unit.

2. The substrate processing apparatus of claim 1, wherein, in the pressure raising process, the controller causes the supply of the processing fluid from the second fluid supply unit to be stopped and the processing fluid to be supplied from the first fluid supply unit into the processing container until the pressure within the processing container reaches the processing pressure via the critical pressure from a point in time when the supply of the processing fluid into the processing container starts.

3. The substrate processing apparatus of claim 1, wherein, in the pressure raising process, the controller causes the supply of the processing fluid from the second fluid supply unit to be stopped and the processing fluid to be supplied from the first fluid supply unit into the processing container until the pressure within the processing container reaches the critical pressure of the processing fluid from a point in time when a supply of the processing fluid into the processing container starts, and causes the supply of the processing fluid from the first fluid supply unit to be stopped and the processing fluid to be supplied from the second fluid supply unit into the processing container, or the processing fluid to be supplied from both the first and second fluid supply units into the processing container, until the pressure within the processing container reaches the processing pressure after reaching the critical pressure of the processing fluid.

4. The substrate processing apparatus of claim 1, wherein the first fluid supply unit is provided to supply the processing fluid from a position below a central portion of the substrate held by the substrate holder, toward the central portion of the substrate.

5. The substrate processing apparatus of claim 1, wherein the second fluid supply unit is provided to supply the processing fluid from a side of the substrate substantially in a horizontal direction.

6. The substrate processing apparatus of claim 5, wherein the second fluid supply unit is provided to supply the processing fluid in parallel to the substrate from a position higher than an upper surface of the substrate, at the side of the substrate.

7. A substrate processing method comprising:
accommodating a substrate having a pattern formed on a surface thereof and a liquid adhering to the surface, in a processing container;
raising a pressure within the processing container to a processing pressure higher than a critical pressure of the processing fluid by supplying a pressurized processing fluid to the processing container; and
performing a circulation process of supplying the pressurized processing fluid to the processing container and discharging the processing fluid from the processing container while keeping a pressure at which at least the processing fluid is maintained in a supercritical state, within the processing container,
wherein, in the raising the pressure, the pressurized processing fluid is supplied from a first fluid supply unit provided below the substrate until at least the pressure within the processing container reaches the critical pressure of the processing fluid,
in the performing the circulation process, the pressurized processing fluid is supplied from a second fluid supply unit provided at a side of the substrate, and
in the raising the pressure, the pressurized processing fluid is not supplied from the second fluid supply unit until at least the pressure within the processing container reaches the critical pressure of the processing fluid.

8. The substrate processing method of claim 7, wherein, in the raising the pressure, the processing fluid is supplied into the processing container using the first fluid supply unit without using the second fluid supply unit until the pressure within the processing container reaches the processing pressure via the critical pressure from a point in time when the supply of the processing fluid into the processing container starts.

9. The substrate processing method of claim 8, wherein, in the raising the pressure, the processing fluid is supplied into the processing container using the first fluid supply unit without using the second fluid supply unit until the pressure within the processing container reaches the critical pressure of the processing fluid from a point in time when a supply of the processing fluid into the processing container starts, and
the processing fluid is supplied into the processing container using the second fluid supply unit without using the first fluid supply unit or the processing fluid is supplied into the processing container using both the first and second fluid supply units until the pressure within the processing container reaches the processing pressure after reaching the critical pressure of the processing fluid.

10. A non-transitory computer-readable storage medium storing a computer-executable program that, when executed, causes a computer to control a substrate processing apparatus to execute the substrate processing method of claim 7.

* * * * *